United States Patent
David et al.

(10) Patent No.: US 8,203,153 B2
(45) Date of Patent: Jun. 19, 2012

(54) III-V LIGHT EMITTING DEVICE INCLUDING A LIGHT EXTRACTING STRUCTURE

(75) Inventors: Aurelien J. F. David, San Francisco, CA (US); Michael R. Krames, Los Altos, CA (US); Melvin B. McLaurin, Mountain View, CA (US)

(73) Assignees: Koninklijke Philips Electronics N.V., Eindhoven (NL); Philips Lumileds LightingCompany, LLC, San Jose, CA (US)

( * ) Notice: Subject to any disclaimer, the term of this patent is extended or adjusted under 35 U.S.C. 154(b) by 287 days.

(21) Appl. No.: 12/688,209

(22) Filed: Jan. 15, 2010

(65) Prior Publication Data
US 2011/0175112 A1    Jul. 21, 2011

(51) Int. Cl.
*H01L 31/12* (2006.01)
*H01L 33/00* (2010.01)
(52) U.S. Cl. ............... 257/79; 257/E33.001; 438/22
(58) Field of Classification Search ........... 257/E33.001, 257/79; 438/22
See application file for complete search history.

(56) References Cited

U.S. PATENT DOCUMENTS

| | | | |
|---|---|---|---|
| 5,374,564 | A | 12/1994 | Bruel |
| 7,071,494 | B2 | 7/2006 | Steigerwald et al. |
| 7,361,938 | B2 | 4/2008 | Mueller et al. |
| 7,632,697 | B2 * | 12/2009 | Seo ................ 438/49 |
| 2005/0026394 | A1 | 2/2005 | Letertre et al. |
| 2006/0006407 | A1 | 1/2006 | Kim et al. |
| 2006/0060888 | A1 | 3/2006 | Kim et al. |
| 2007/0072324 | A1 | 3/2007 | Krames et al. |
| 2008/0251803 | A1 | 10/2008 | Cho et al. |
| 2008/0283821 | A1 | 11/2008 | Park et al. |

OTHER PUBLICATIONS

By Journal of Applied Physics 106, 024309 (2009); Entitled: "Growth of Embedded Photonic Crystals for GaN-based Otoelectronic Devices"; Downloaded Aug. 17, 2009 to 207.47.13.91. Redistribution subject to AIP license or copyright; see http://jap.aip.org/jap/copyright.jsp; pp. 1-8.

* cited by examiner

*Primary Examiner* — Lex Malsawma

(57) ABSTRACT

Embodiments of the invention include a substrate comprising a host and a seed layer bonded to the host, and a semiconductor structure comprising a light emitting layer disposed between an n-type region and a p-type region grown over the seed layer. A variation in index of refraction in a direction perpendicular to a growth direction of the semiconductor structure is disposed between the host and the light emitting layer.

15 Claims, 3 Drawing Sheets

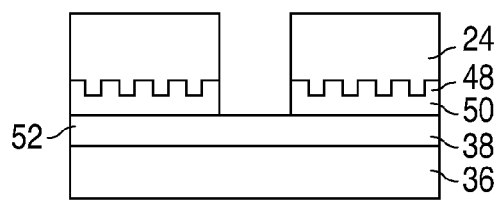
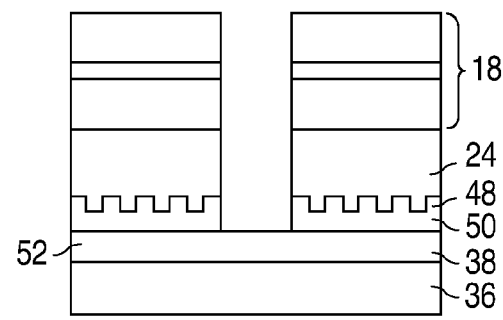
FIG. 12  FIG. 13
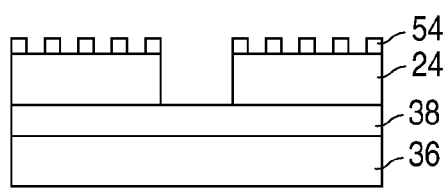
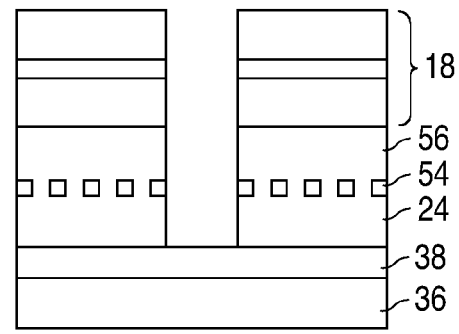
FIG. 14  FIG. 15
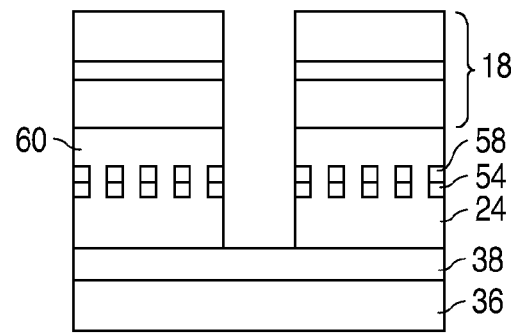
FIG. 16

III-V LIGHT EMITTING DEVICE INCLUDING A LIGHT EXTRACTING STRUCTURE

BACKGROUND

1. Field of Invention

The present invention relates to semiconductor light emitting devices including light extracting structures.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

FIG. 1 illustrates a composite growth substrate, described in more detail in US 2007/0072324, which is incorporated herein by reference. "Substrate 10 includes a host substrate 12, a seed layer 16, and a bonding layer 14 that bonds host 12 to seed 16 . . . [T]he layers in substrate 10 are formed from materials that can withstand the processing conditions required to grow the semiconductor layers in the device. For example, in the case of a III-nitride device grown by MOCVD, each of the layers in substrate 10 must be able to tolerate an $H_2$ ambient at temperatures in excess of 1000° C.; in the case of a III-nitride device grown by MBE, each of the layers in substrate 10 must be able to tolerate temperatures in excess of 600° C. in a vacuum.

"Host substrate 12 provides mechanical support to substrate 10 and to the semiconductor device layers 18 grown over substrate 10. Host substrate 12 is generally between 3 and 500 microns thick and is often thicker than 100 microns. In embodiments where host substrate 12 remains part of the device, host substrate 12 may be at least partially transparent if light is extracted from the device through host substrate 12. Host substrate 12 generally does not need to be a single crystal material since device layers 18 are not grown directly on host substrate 12. In some embodiments, the material of host substrate 12 is selected to have a coefficient of thermal expansion (CTE) that matches the CTE of device layers 18 and the CTE of seed layer 16. Any material able to withstand the processing conditions of epitaxial layers 18 may be suitable . . . including semiconductors, ceramics, and metals. Materials such as GaAs which have a CTE desirably close to the CTE of device layers 18 but which decompose through sublimation at the temperatures required to grow III-nitride layers by MOCVD may be used with an impermeable cap layer such as silicon nitride deposited between the GaAs host and seed layer 16.

"Seed layer 16 is the layer on which device layers 18 are grown, thus it must be a material on which III-nitride crystal can nucleate. Seed layer 16 may be between about 50 Å and 1 μm thick. In some embodiments seed layer 16 is CTE-matched to the material of device layers 18. Seed layer 16 is generally a single crystal material that is a reasonably close lattice-match to device layers 18. Often the crystallographic orientation of the top surface of seed layer 16 on which device layers 18 are grown is the wurtzite [0001] c-axis. In embodiments where seed layer 16 remains part of the finished device, seed layer 16 may be transparent or thin if light is extracted from the device through seed layer 16.

"One or more bonding layers 14 bond host substrate 12 to seed layer 16. Bonding layer 14 may be between about 100 Å and 1 μm thick. Examples of suitable bonding layers including $SiO_x$ such as $SiO_2$, $SiN_x$ such as $Si_3N_4$, $HfO_2$, mixtures thereof, metals such as Mo, Ti, TiN, other alloys, and other semiconductors or dielectrics. Since bonding layer 14 connects host substrate 12 to seed layer 16, the material forming bonding layer 14 is selected to provide good adhesion between host 12 and seed 16. In some embodiments, bonding layer 14 is a release layer formed of a material that can be etched by an etch that does not attack device layers 18, thereby releasing device layers 18 and seed layer 16 from host substrate 12. For example, bonding layer 14 may be $SiO_2$ which may be wet-etched by HF without causing damage to III-nitride device layers 18. In embodiments where bonding layer 14 remains part of the finished device, bonding layer 14 is preferably transparent or very thin. In some embodiments, bonding layer 14 may be omitted, and seed layer 16 may be adhered directly to host substrate 12.

"Further strain relief in epitaxial layers 18 may be provided by forming the seed layer as stripes or a grid over bonding layer 14, rather than as a single uninterrupted layer. Alternatively, seed layer may be formed as a single uninterrupted layer, then removed in places, for example by forming trenches, to provide strain relief. A single uninterrupted seed layer 16 may be attached to host substrate 12 through bonding layer 14, then patterned by conventional lithography techniques to remove portions of the seed layer to form stripes. The edges of each of the seed layer stripes may provide additional strain relief by concentrating dislocations within epitaxial layers 18 at the edges of the stripes of seed layer. The composition of seed layer 16, bonding layer 14, and the nucleation layer may be selected such that the nucleation layer material nucleates preferentially on seed layer 16, not on the portions of bonding layer 14 exposed by the spaces between the portions of seed layer 16.

"On a wafer of light emitting devices, the trenches in seed layer 16 . . . may be spaced on the order of a single device width, for example, hundred of microns or millimeters apart. A wafer of devices formed on a composite substrate with a patterned seed layer may be divided such that the edges of the seed layer portions are not located beneath the light emitting layer of individual devices, since the dislocations concentrated at the edge of the seed layers may cause poor performance or reliability problems. Alternatively, multiple trenches may be formed within the width of a single device, for example, spaced on the order of microns or tens of microns apart. Growth conditions on such substrates may be selected such that the nucleation layer formed over seed layer 16, or a later epitaxial layer, coalesces over the trenches formed in seed layer 16, such that the light emitting layer of the devices on the wafer is formed as a continuous layer uninterrupted by the trenches in seed layer 16.

When the seed layer is a III-nitride material, "the seed layer is grown strained on the growth substrate. When the seed layer 16 is connected to host substrate 12 and released from the growth substrate, if the connection between seed layer 16 and host substrate 16 is compliant, for example a compliant bonding layer 14, seed layer 16 may at least partially relax. Thus, though the seed layer is grown as a strained layer, the composition may be selected such that the lattice constant of the seed layer, after the seed layer is released from the growth substrate and relaxes, is reasonably close or matched to the lattice constant of the epitaxial layers 18 grown over the seed layer.

"For example, when a III-nitride device is conventionally grown on $Al_2O_3$, the first layer grown on the substrate is generally a GaN buffer layer with an a lattice constant of about 3.19. The GaN buffer layer sets the lattice constant for all of the device layers grown over the buffer layer, including the light emitting layer which is often InGaN. Since relaxed, free standing InGaN has a larger a lattice constant than GaN, the light emitting layer is strained when grown over a GaN buffer layer. In contrast, . . . an InGaN seed layer may be grown strained on a conventional substrate, then bonded to a host and released from the growth substrate such that the InGaN seed layer at least partially relaxes. After relaxing, the InGaN seed layer has a larger a lattice constant than GaN. As such, the lattice constant of the InGaN seed layer is a closer match than GaN to the lattice constant of a relaxed free standing layer of the same composition as the InGaN light emitting layer. The device layers grown over the InGaN seed layer, including the InGaN light emitting layer, will replicate the lattice constant of the InGaN seed layer. Accordingly, an InGaN light emitting layer with a relaxed InGaN seed layer lattice constant is less strained than an InGaN light emitting layer with a GaN buffer layer lattice constant. Reducing the strain in the light emitting layer may improve the performance of the device.

"III-nitride seed layer materials may require additional bonding steps in order to form a composite substrate with a III-nitride seed layer in a desired orientation. III-nitride layers grown on sapphire or SiC growth substrates are typically grown as c-plane wurtzite. Such wurtzite III-nitride structures have a gallium face and a nitrogen face. III-nitrides preferentially grow such that the top surface of the grown layer is the gallium face, while the bottom surface (the surface adjacent to the growth substrate) is the nitrogen face. Simply growing seed layer material conventionally on sapphire or SiC then connecting the seed layer material to a host and removing the growth substrate would result in a composite substrate with a III-nitride seed layer with the nitrogen face exposed. As described above, III-nitrides preferentially grow on the gallium face, i.e. with the gallium face as the top surface, thus growth on the nitrogen face may undesirably introduce defects into the crystal, or result in poor quality material as the crystal orientation switches from an orientation with the nitrogen face as the top surface to an orientation with the gallium face as the top surface.

"To form a composite substrate with a III-nitride seed layer with the gallium face as the top surface, seed layer material may be grown conventionally on a growth substrate, then bonded to any suitable first host substrate, then separated from the growth substrate, such that the seed layer material is bonded to the first host substrate through the gallium face, leaving the nitrogen face exposed by removal of the growth substrate. The nitrogen face of the seed layer material is then bonded to a second host substrate 10, the host substrate of the composite substrate . . . . After bonding to the second host substrate, the first host substrate is removed by a technique appropriate to the growth substrate. In the final composite substrate, the nitrogen face of the seed layer material 16 is bonded to host substrate 12 (the second host substrate) through optional bonding layer 14, such that the gallium face of III-nitride seed layer 16 is exposed for growth of epitaxial layers 18.

"For example, a GaN buffer layer is conventionally grown on a sapphire substrate, followed by an InGaN layer which will form the seed layer of a composite substrate. The InGaN layer is bonded to a first host substrate with or without a bonding layer. The sapphire growth substrate is removed by laser melting of the GaN buffer layer adjacent to the sapphire, then the remaining GaN buffer layer exposed by removing the sapphire is removed by etching, resulting in an InGaN layer bonded to a first host substrate. The InGaN layer may be implanted with a material such as hydrogen, deuterium, or helium to form a bubble layer at a depth corresponding to the desired thickness of the seed layer in the final composite substrate . . . . The InGaN layer may optionally be processed to form a surface sufficiently flat for bonding. The InGaN layer is then bonded with or without a bonding layer to a second host substrate, which will form the host in the final composite substrate. The first host substrate, InGaN layer, and second host substrate are then heated as described above, causing the bubble layer implanted in the InGaN layer to expand, delaminating the thin seed layer portion of the InGaN layer from the rest of the InGaN layer and the first host substrate, resulting in a finished composite substrate as described above with an InGaN seed layer bonded to a host substrate."

SUMMARY

Embodiments of the invention provide a light extracting structure in a device grown on a composite substrate.

Embodiments of the invention include a substrate comprising a host and a seed layer bonded to the host, and a semiconductor structure comprising a light emitting layer disposed between an n-type region and a p-type region grown over the seed layer. A variation in index of refraction in a direction perpendicular to a growth direction of the semiconductor structure is disposed between the host and the light emitting layer.

The variation in index of refraction may extract light from the device.

BRIEF DESCRIPTION OF THE DRAWINGS

FIG. 12 illustrates a composite substrate including a seed layer, a bonding layer, and a host substrate.

FIG. 13 illustrates III-nitride device layers grown on the composite substrate of FIG. 12.

FIG. 14 illustrates a patterned layer formed over the seed layer of a composite substrate.

FIG. 15 illustrates growth on the substrate of FIG. 14 of semiconductor material under conditions favoring horizontal growth.

FIG. 16 illustrates growth on the substrate of FIG. 14 of semiconductor material under conditions favoring vertical growth.

DETAILED DESCRIPTION

In embodiments of the invention, a structure for extracting light is disposed between the host substrate and the light emitting layer of a III-nitride device grown on a composite substrate. The light extracting structure may be, for example, a variation in index of refraction in a direction perpendicular to a growth direction of the III-nitride device layers. The variation in index of refraction may be organized, random, or partially organized, such as a quasi-crystal photonic structure. Though below examples illustrate pillars of material forming the variation in index of refraction, the hills and valleys of the variation may take any shape, as long as a variation in index of refraction results. For example, instead of pillars, pyramids of material may be used. The characteristic lateral size of the variation in index of refraction may be on the order of one to a few optical wavelengths, for example, between 100 nm and 10 microns in some embodiments, between 300 nm and 3 microns in some embodiments, and between 500 nm and 1 micron in some embodiments. The vertical extent of the variation in index of refraction may also be on the order of one to a few optical wavelengths, for example, between 100 nm and 10 microns in some embodiments, between 300 nm and 3 microns in some embodiments, and between 500 nm and 1 micron in some embodiments. The variation in index of refraction is, in some embodiments, a contrast between a high index material (such as, for example, III-nitride material, high index glass, $TiO_2$, or $Ta_2O_5$) and a low index material (such as, for example, $SiO_2$, $MgF_2$, $CaF_2$, air, or a porous material such as a porous oxide or dielectric). The difference in index of refraction between the two materials is at least 0.1 in some embodiments, at least 0.3 in some embodiments, and at least 0.5 in some embodiments.

The light extracting structure may be formed in a bonding layer between the host substrate and the seed layer, as illustrated in FIGS. 2-7; within the seed layer, as illustrated in FIGS. 8-13; or on the top surface of the seed layer, as illustrated in FIGS. 14-16.

Besides the specific materials and methods described below, the materials and methods described in US 2007/0072324 may be used in the structures and methods illustrated in FIGS. 2-16.

Figure 1:
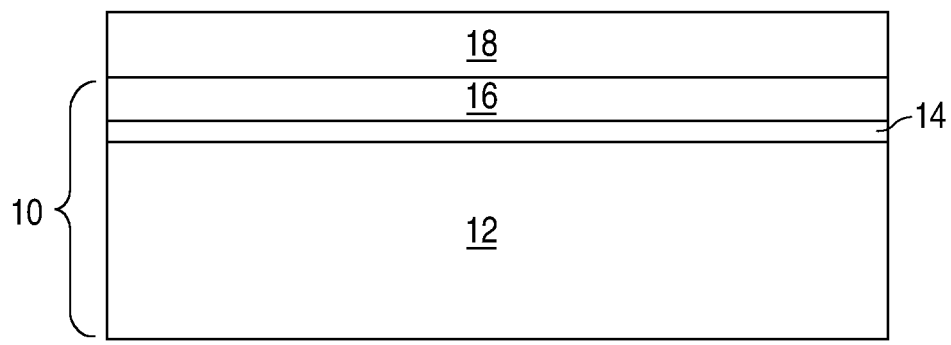
FIG. 1 illustrates a III-nitride semiconductor structure grown on a composite growth substrate including a host substrate, a bonding layer, and a seed layer.
Figure 2:
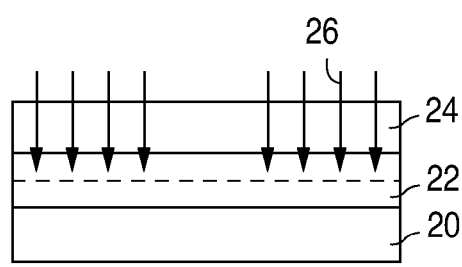
FIG. 2 illustrates a seed layer grown on a substrate.

In FIG. 2, a III-nitride seed layer 24 is conventionally grown on a donor substrate 20, which may be, for example, sapphire, Si, or SiC. Seed layer 24 may be grown over a sacrificial semiconductor layer 22, which is implanted with an implant species 26 such as $H^+$ that facilitates later separation of the donor substrate 20 from the seed layer 24. In some embodiments, sacrificial layer 22 is GaN and seed layer 24 is InGaN with an InN composition greater than zero and up to 12%.

Figure 3:
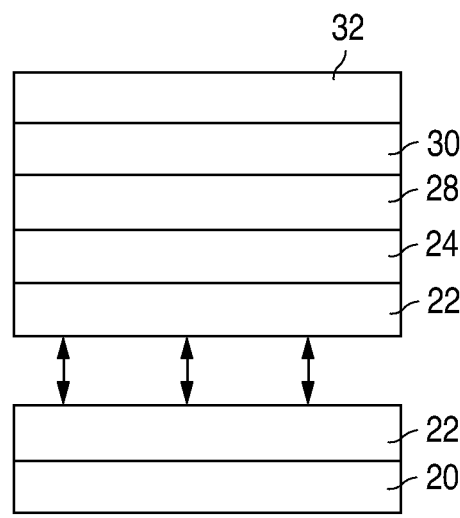
FIG. 3 illustrates bonding a seed layer to a temporary substrate and removing the growth substrate.

In FIG. 3, an optional bonding layer 30 and a compliant layer 28 are formed on a temporary substrate 32. The seed layer 24 of the structure illustrated in FIG. 2 is bonded to the temporary substrate 32 through compliant layer 28. In some embodiments, the optional bonding layer 30 is one or more oxides, nitrides, carbides, or fluorides of silicon, aluminum, boron, phosphorus, zinc, gallium, germanium, indium, tin, antimony, lead, bismuth, titanium, tungsten, magnesium, calcium, potassium, nickel, yttrium, zirconium, hafnium, neodymium, and tantalum. In some embodiments, compliant layer 28 is borophosphosilicate glass (BPSG) or other commercial glasses deposited by, for example, evaporation, sputtering, and sedimentation.

The seed layer 24 is separated from donor substrate 20 by activating the implanted species 26 to split the sacrificial layer 22. Implanting a sacrificial layer and separating a seed layer from a donor substrate by activating the implant species is described in more detail in US Patent Application Publication 2005/0026394 and U.S. Pat. No. 5,374,564, which are incorporated herein by reference. Alternatively, the donor substrate may be removed by laser melting of the sacrificial layer 22.

Figure 4:
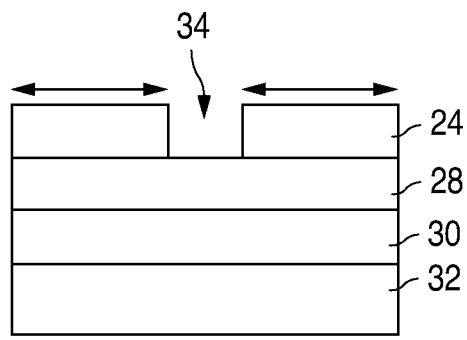
FIG. 4 illustrates a seed layer after patterning.

In FIG. 4, any remaining sacrificial layer 22 is removed from the seed layer 24, and trenches 34 are etched in the seed layer 24. The structure is treated to cause the regions of strained seed layer material 24 to expand and relax, for example by heating the compliant layer 28 such that the regions of seed layer material glide over the compliant layer.

Figure 5:
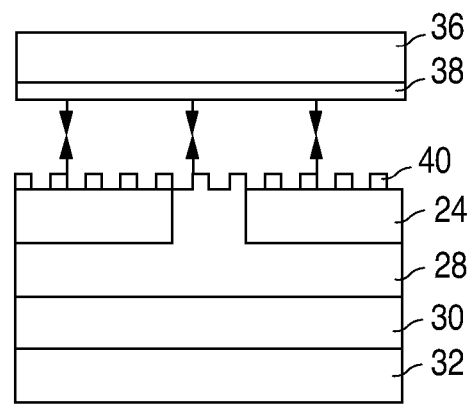
FIG. 5 illustrates a light extraction structure formed on a seed layer after relaxation.

In FIG. 5, a light extraction structure is formed in a layer formed over the seed layer 24 such as, for example, a bonding layer. The seed layer is bonded to a host substrate, for example by applying heat and/or pressure between the two structures. In some embodiments, the host substrate 36 is sapphire. The light extraction feature may be, for example, a variation in index of refraction. Patterned layer 40 and bonding layer 38 are formed on one or both of the seed layer 24 and the host substrate 36. Patterned layers may be formed on one or more surface including seed layer 24, the bonding layers, and host substrate 36. Bonding layers 40 and 38 may be, for example, oxides of silicon or any other suitable material such as the materials listed above in reference to bonding layer 30 of FIG. 3. One or both of the bonding layers are patterned to form a variation in index of refraction between the bonding layer material and the air or other gas filling the gaps formed in the bonding layer during patterning. One example of a variation in index of refraction is a periodic lattice of holes or a grid formed in the bonding layer.

Figure 6:
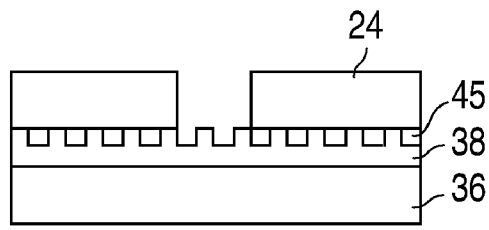
FIG. 6 illustrates a composite substrate including a seed layer, a bonding layer, and a host substrate.

The temporary substrate 32 is then removed, for example by etching away the bonding layer 30. The compliant layer 28 is also removed, exposing the surface of seed layer 24, as illustrated in the completed composite substrate shown in FIG. 6. The light extraction feature 45 may be disposed adjacent the seed layer 24, as illustrated in FIG. 6, adjacent host substrate 36, or between two unpatterned bonding layers which are in direct contact with seed layer 24 and host substrate 36.

Figure 7:
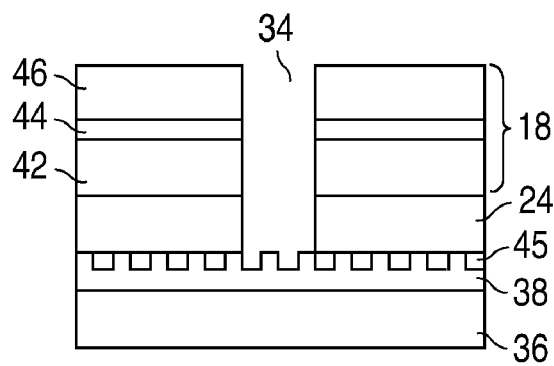
FIG. 7 illustrates III-nitride device layers grown on the composite substrate of FIG. 6.

In the structure illustrated in FIG. 7, device layers 18 are grown over the relaxed seed layer regions 24. The composition of the layer adjacent to seed layer 24 may be chosen for its lattice constant or other properties, and/or for its ability to nucleate on the material of seed layer 24. The device layers may be grown under conditions that favor vertical growth over horizontal growth, to maintain the spacing 34 between individual regions, or under conditions that favor horizontal growth over vertical growth, to form a single coalesced layer over seed layer regions 24.

The device layers 18 include an n-type region 42, a light emitting or active region 44, and a p-type region 46. An n-type region 42 is often grown first, though in some embodiments a p-type region may be grown first. The n-type region may include multiple layers of different compositions and dopant concentration including, for example, preparation layers such as buffer layers or nucleation layers, which may be n-type or not intentionally doped, release layers designed to facilitate later release of the composite substrate or thinning of the semiconductor structure after substrate removal, and n- or even p-type device layers designed for particular optical or electrical properties desirable for the light emitting region to efficiently emit light. In some embodiments, n-type region 42 is InGaN or includes one or more InGaN layers. GaN grown on a seed layer with an expanded lattice constant may be in tension, thus the thickness of any GaN layer in the device may be limited to prevent cracking.

A light emitting or active region 44 is grown over the n-type region 42. Examples of suitable light emitting regions include a single thick or thin light emitting layer, or a multiple quantum well light emitting region including multiple thin or thick quantum well light emitting layers separated by barrier layers. For example, a multiple quantum well light emitting region may include multiple light emitting layers, each with a thickness of 25 Å or less, separated by barriers, each with a thickness of 100 Å or less. In some embodiments, the thickness of each of the light emitting layers in the device is thicker than 50 Å.

A p-type region 46 is grown over the light emitting region 44. Like the n-type region, the p-type region may include multiple layers of different composition, thickness, and dopant concentration, including layers that are not intentionally doped, or n-type layers. In some embodiments, p-type region 46 is InGaN or includes one or more InGaN layers.

Figure 8:
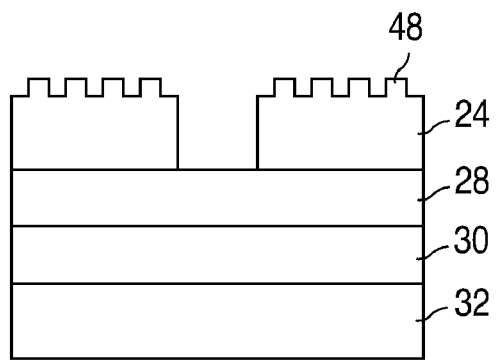
FIG. 8 illustrates a patterned seed layer.

FIGS. 8-13 illustrate forming a composite substrate and III-nitride light emitting device with a light extraction structure within the seed layer. A seed layer 24 is grown and attached to a temporary substrate, as illustrated in FIGS. 2-4 and described in accompanying text. In FIG. 8, the top surface of the seed layer 24 is patterned 48. Seed layer 24 may be patterned before or after relaxation, which is illustrated for example in FIG. 4. As an example of patterning, a periodic lattice of holes or a grid may be formed in the top surface of seed layer 24.

Figure 9:
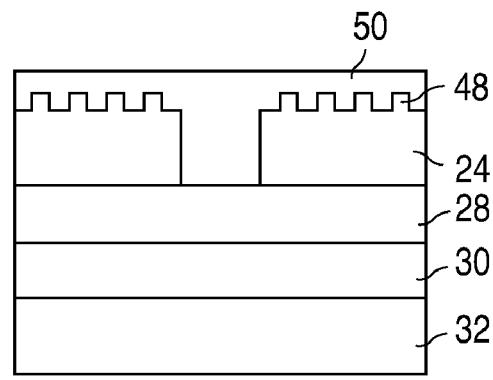
FIG. 9 illustrates a contrasting material disposed over the patterned seed layer of FIG. 8.

In FIG. 9, a second material 50 is disposed over the patterned top surface 48 of the seed layer 24 and fills in the gaps formed during the patterning of the seed layer described above. The second material 50 has an index of refraction different from the index of refraction of the seed layer 24. In some embodiments, the second material 50 has an index of refraction less than 2. Examples of suitable second materials 50 include the materials listed above in reference to bonding layer 30 of FIG. 3. The top surface of the second material 50 may optionally be polished.

Figure 10:
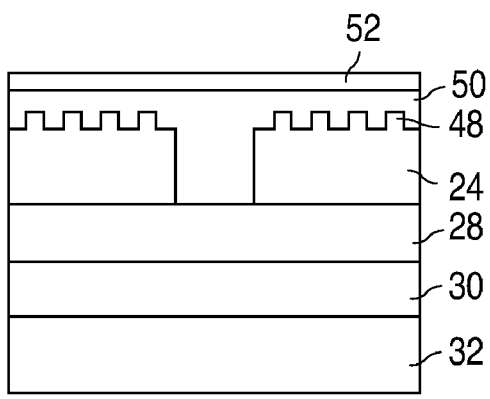
FIG. 10 illustrates a bonding layer formed on the structure of FIG. 9.

In FIG. 10, if second material 50 is not suitable for bonding, an optional bonding layer 52, such as a layer of an oxide of silicon, is formed over second material 50 and optionally polished.

Figure 11:
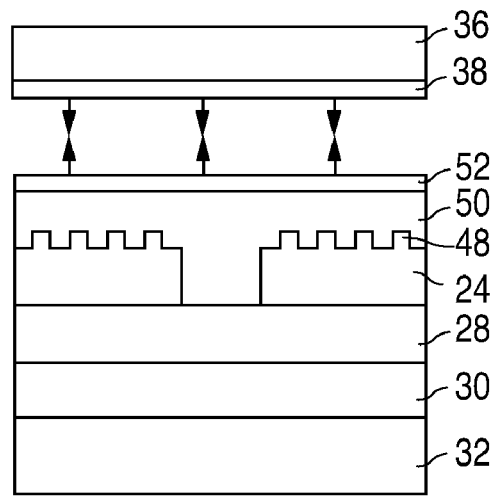
FIG. 11 illustrates the structure of FIG. 10 bonded to a host substrate.

In FIG. 11, a bonding layer 38 is formed on host substrate 36, then the seed layer 24 is bonded to host substrate 36 through bonding layers 38 and 52.

In FIG. 12, the temporary substrate 32, bonding layer 30, and compliant layer 28 are removed.

In FIG. 13, III-nitride device layers 18 are grown on the seed layer, as described above.

FIGS. 14-16 illustrate forming a III-nitride light emitting device with a light extraction structure disposed on a surface of the seed layer. The composite substrate of FIG. 14 is formed by bonding the seed layer of the structure of FIG. 4 to a host substrate 36, through one or more bonding layers 38 formed on the seed layer 24, the host substrate 36, or both. The temporary substrate 32, bonding layer 30, and compliant layer 28 are then removed, as described above. A layer of material 54, which may be, for example, one or more of the materials listed above in reference to bonding layer 30 of FIG. 3, is formed on the surface of seed layer 24, then patterned to form, for example, a periodic lattice of holes or a grid.

In FIG. 15, a semiconductor layer 56 is grown over seed layer 24 and patterned material 54, under conditions that favor filling in the gaps between regions of material 54. The contrast in index of refraction between the semiconductor material 56 and the patterned material 54 forms the light extraction structure. Device layers 18 are grown on semiconductor layer 56, as described above.

Alternatively, as illustrated in FIG. 16, a semiconductor layer 60 may be grown over seed layer 24 and patterned material 54 under conditions that favor vertical growth over horizontal growth. As a result, pillars of semiconductor material separated by air pockets 58 form over patterned material 54. The growth conditions may then be switched to conditions that favor horizontal growth, to form a coalesced, planar layer 60 over pores 58. The contrast in index of refraction between pores 58 and semiconductor material 60, and between patterned material 54 and semiconductor material 60, forms the light extraction structure. The contrast in index of refraction between pores 58 and semiconductor material 60 may cause sufficient light extraction, even if patterned material 54 is very thin, for example, less than 5 nm thick. Device layers are grown on semiconductor layer 60, as described above.

In some embodiments, patterned material 54 is used to pattern the underlying seed layer 24, for example by conventional etching techniques. For example, openings aligned with the holes in or the remaining portions of patterned material 54 may be formed in seed layer 24. The openings in seed layer 24 may extend through the entire thickness of seed layer 24 such that bonding layer 38 is exposed, or they may extend through only a part of the thickness of seed layer 24. After patterning the seed layer, patterned material 54 is removed by conventional techniques. Semiconductor material may be grown over the patterned seed layer under conditions that favor vertical growth over horizontal growth, such that pores are retained in the seed layer and/or the first-grown portion of the semiconductor structure. The growth conditions may then be switched to conditions that favor horizontal growth, to form a coalesced, planar layer over the pores. The device layers 18 are then grown. The structure is similar to the structure illustrated in FIG. 16, except without patterned material 54 under pores 58.

In some embodiments, a reflective p-contact is formed on the p-type region on each region. Portions of the p-contact, the p-type region, and the light emitting region may be removed from each region to expose a portion of the n-type region, on which an n-contact is formed. The device is then connected to a mount by interconnects aligned with the n- and p-contacts on each region. Individual regions may be interconnected by electrical connections formed on the semiconductor structure or on the mount. All or part of the host substrate, bonding layers, and seed layer may be removed from the device, though in some embodiments they remain part of the finished device. The light extraction structure generally remains a part of the device. In some embodiments, the p-contact is formed on each p-type region then an n-contact is formed on the opposite side of the semiconductor structure, either on a conductive host substrate, bonding layer, or seed layer or on a surface of the n-type region exposed by removing the composite growth substrate.

In some embodiments, the device layers 18 shown in FIGS. 7, 13, 15, and 16 may be grown to coalesce over the trenches between individual regions, to form a single region of material uninterrupted by trenches 34.

Packaging devices including several islands of semiconductor material, such as the devices described above, is described in more detail in U.S. application Ser. No. 12/236,853, titled "Semiconductor Light Emitting Devices Grown On Composite Substrates" and incorporated herein by reference.

An optional wavelength converting material, which absorbs light emitted by the light emitting region and emits light of one or more different peak wavelengths, may be disposed over the light emitting layer. The wavelength converting material may be, for example, one or more powder phosphors disposed in a transparent material such as silicone or epoxy and deposited on the LED by screen printing or stenciling, one or more powder phosphors formed by electrophoretic deposition, or one or more ceramic phosphors glued or bonded to the LED, one or more dyes, or any combination of the above-described wavelength converting layers. Ceramic phosphors are described in more detail in U.S. Pat. No. 7,361,938, which is incorporated herein by reference. The wavelength converting material may be formed such that a portion of light emitted by the light emitting region is unconverted by the wavelength converting material. In some examples, the unconverted light is blue and the converted light is yellow, green, and/or red, such that the combination of unconverted and converted light emitted from the device appears white.

In some embodiments, polarizers, dichroic filters or other optics known in the art are formed over the islands or over the wavelength converting material.

In some embodiments, the devices described above are combined with other light extracting features, such as macroscopic shaping of the LED. For example, if each region is the size of a single light emitting diode (e.g. on the order of hundreds of microns or millimeters wide), the sidewalls of the LED may be angled by etching or polishing.

Having described the invention in detail, those skilled in the art will appreciate that, given the present disclosure, modifications may be made to the invention without departing from the spirit of the inventive concept described herein. For example, though the above examples are directed to III-nitride devices, devices made from other materials systems such as other III-V materials, III-As or III-P devices, or II-VI devices may be used in embodiments of the invention. Also, though the above examples are grown on composite substrates, in some embodiments devices may be grown on other substrates such as, for example, Si substrates. The variation in index of refraction that forms the light extraction region may be formed on the surface of the Si substrate or in a semiconductor or non-semiconductor layer formed on the Si substrate. Therefore, it is not intended that the scope of the invention be limited to the specific embodiments illustrated and described.

What is being claimed is:

1. A device comprising:
    a substrate comprising:
        a host; and
        a seed layer bonded to the host; and
    a semiconductor structure grown over the seed layer, the semiconductor structure comprising a light emitting layer disposed between an n-type region and a p-type region;
    wherein a variation in index of refraction in a direction perpendicular to a growth direction of the semiconductor structure is disposed between the host and the light emitting layer.

2. The device of claim 1 further comprising a non-semiconductor layer disposed between the seed layer and the semiconductor structure, wherein
    the non-semiconductor layer is patterned to form a plurality of openings; and
    the semiconductor structure is grown such that semiconductor material fills in the openings in the non-semiconductor layer.

3. The device of claim 1 further comprising:
    a non-semiconductor layer disposed between the seed layer and the semiconductor structure, wherein the non-semiconductor layer is patterned to form a plurality of openings; and
    pores disposed in the semiconductor structure over the areas of the non-semiconductor layer disposed between the openings.

4. The device of claim 1 wherein:
    the variation in index of refraction comprises portions of a bonding layer separated by gaps; and
    the variation in index of refraction is disposed between the host and the seed layer.

5. The device of claim 4 wherein the gaps are filled with gas and are in direct contact with the seed layer.

6. The device of claim 4 wherein the gaps are filled with gas and are in direct contact with the host.

7. The device of claim 4 wherein the gaps are filled with gas and spaced apart from the seed layer and the host.

8. The device of claim 1 wherein the variation in index of refraction comprises a plurality of openings formed in a surface of the seed layer opposite the semiconductor structure and filled with a material having an index of refraction less than 2.

9. The device of claim 1 wherein the variation in index of refraction comprises a plurality of pores disposed at an interface between the semiconductor structure and the seed layer.

10. The device of claim 1 wherein:
    the variation in index of refraction comprises a plurality of regions of first material having a first index of refraction separated by a plurality of regions of second material having a second index of refraction; and
    each of the regions of first material and each of the regions of second material has a lateral extent, in the direction of the variation in index of refraction, between 100 nm and 10 microns.

11. The device of claim 1 wherein the variation in index of refraction has a height between 100 nm and 10 microns.

12. A method comprising:
    providing a substrate comprising:
        a host; and
        a seed layer bonded to the host; and
    growing on the substrate a semiconductor structure comprising a light emitting layer disposed between an n-type region and a p-type region;
    wherein a variation in index of refraction in a direction perpendicular to a growth direction of the semiconductor structure is disposed between the host and the light emitting layer.

13. The method of claim 12 further comprising removing the host after growing the semiconductor structure.

14. The method of claim 12 further comprising forming the variation in index of refraction by:
    forming a non-semiconductor layer on the seed layer;
    patterning the non-semiconductor layer to form a plurality of openings; and
    growing the semiconductor structure such that semiconductor material fills in the openings in the non-semiconductor layer.

15. The method of claim 12 further comprising forming the variation in index of refraction by:
   forming an non-semiconductor layer on the seed layer;
   patterning the non-semiconductor layer to form a plurality of openings; and
   growing the semiconductor structure such that semiconductor material fills in the openings in the non-semiconductor layer and pores are formed over the areas of the non-semiconductor layer disposed between the openings.

* * * * *